(12) United States Patent
Wu et al.

(10) Patent No.: US 7,345,321 B2
(45) Date of Patent: *Mar. 18, 2008

(54) HIGH-BRIGHTNESS GALLIUM-NITRIDE BASED LIGHT EMITTING DIODE STRUCTURE

(75) Inventors: Liang-Wen Wu, Banciao (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 147 days.

This patent is subject to a terminal disclaimer.

(21) Appl. No.: 11/266,461

(22) Filed: Nov. 3, 2005

(65) Prior Publication Data

US 2006/0145179 A1 Jul. 6, 2006

Related U.S. Application Data

(63) Continuation-in-part of application No. 11/029,584, filed on Jan. 5, 2005, now Pat. No. 7,049,638.

(51) Int. Cl.
*H01L 29/22* (2006.01)
*H01L 33/00* (2006.01)
(52) U.S. Cl. ............... 257/99; 257/13; 257/E33.043
(58) Field of Classification Search ............ None
See application file for complete search history.

(56) References Cited

U.S. PATENT DOCUMENTS 6,291,839 B1 * 9/2001 Lester ............... 257/91
6,900,473 B2 * 5/2005 Yoshitake et al. ........ 257/95

\* cited by examiner

*Primary Examiner*—Evan Pert
*Assistant Examiner*—Ben P Sandvik

(57) ABSTRACT

A GaN-based LED structure is provided so that the brightness and luminous efficiency of the GaN-based LED are enhanced effectively. The greatest difference between the GaN-based LEDs according to the invention and the prior arts lies in the addition of a masking buffer layer and a roughened contact layer on top of the masking buffer layer. The masking buffer layer contains randomly distributed clusters made of a group-IV nitride $Si_xN_y$ ($x,y \geq 1$), a group-II nitride $Mg_wN_z$ ($w,z \geq 1$), or a group-III nitride $Al_sIn_tGa_{1-s-t}N$ ($0 \leq s,t < 1$, $s+t \leq 1$) heavily doped with at least a group-II and group-IV element such as Mg and Si. The roughened contact layer, made of $Al_uIn_vGa_{1-u-v}N$ ($0 \leq u,v < 1$, $u+v \leq 1$), starts from the top surface of an underlying second contact layer not covered by the masking buffer layer's clusters, and then grows upward until it passes (but does not cover) the clusters of the masking buffer layer for an appropriate distance. The total internal reflection that could have been resulted from the GaN-based LEDs' higher index of refraction than that of the atmosphere could be avoided.

24 Claims, 3 Drawing Sheets

HIGH-BRIGHTNESS GALLIUM-NITRIDE BASED LIGHT EMITTING DIODE STRUCTURE

CROSS-REFERENCE TO RELATED APPLICATIONS

This is a continuation-in-part of U.S. application Ser. No. 11/029,584, filed on Jan. 5, 2005 now U.S. Pat. No. 7,049,638.

BACKGROUND OF THE INVENTION

1. Field of the Invention

The present invention generally relates to gallium-nitride based light emitting diodes and, more particularly, to the high-brightness gallium-nitride based light emitting diodes having roughened surfaces.

2. The Prior Arts

Gallium-nitride (GaN) based light-emitting diodes (LEDs), as various colored LEDs can be developed by controlling the GaN-based material's composition, have been the research and development focus in the academic arena and in the industries as well in recent years. One of the research directions regarding GaN-based LEDs lies in the further understanding of the luminous characteristics of GaN-based LEDs. Based on this knowledge, then, methods for enhancing GaN-based LEDs' luminous efficiency and brightness can be developed and discovered. These high-efficiency and high-brightness GaN-based LEDs would soon find their widespread application in outdoor display panels and automobile lamps.

The luminous efficiency of a GaN-based LED is mainly determined by the GaN-based LED's internal quantum efficiency and external quantum efficiency. The former relates to the probability of recombination of electrons and holes, thereby causing photons to be released, within the GaN-based LED's active layer. The more easily the electrons and holes are recombined, the more photons are released, and the higher the luminous efficiency of the GaN-based LED will be. The latter, on the other hand, relates to the probability of photons' successfully escape from the GaN-based LED without being absorbed or trapped inside. The more photons escape from the GaN-based LED, the higher the external quantum efficiency is, and the higher the luminous efficiency of the GaN-based LED will be.

The GaN-based LED's external quantum efficiency is also related to its index of refraction. Generally, the index of refraction of GaN-based LEDs is 2.5, higher than that of the atmosphere (whose index of refraction is 1). As such, total internal reflection would occur and photons released from the active layer would be reflected back to the GaN-based LEDs, significantly reducing the external quantum efficiency.

SUMMARY OF THE INVENTION

Therefore, the present invention provides an epitaxial structure for the GaN-based LEDs so that the limitations and disadvantages in term of their luminous intensity and external quantum efficiency from the prior arts can be obviated practically.

The greatest difference between the GaN-based LEDs according to the present invention and the prior arts lies in the addition of a masking buffer layer and a roughened contact layer on top of the masking buffer layer within the traditional structure of GaN-based LEDs. The masking buffer layer is formed using Metal Organic Chemical Vapor Deposition (MOCVD) to deposit a group-IV nitride such as $Si_xN_y$ (x,y≧1), a group-II nitride such as $Mg_wN_z$ (w,z≧1), or a group-III nitride such as $Al_sIn_tGa_{1-s-t}N$ (0≦s,t<1, s+t≦1) heavily doped with at least a group-II and group-IV element such as Si and Mg. The masking buffer layer is actually a mask containing multiple randomly distributed clusters of $Si_xN_y$, $Mg_wN_z$, or $Al_sIn_tGa_{1-s-t}N$. Then, on top of the masking buffer layer, a roughened contact layer made of $Al_uIn_vGa_{1-u-v}N$ (0≦u,v<1, u+v≦1) is developed. The roughened contact layer does not grow directly on top of the masking buffer layer. Instead, the roughened contact layer starts from the top surface of an underlying second contact layer not covered by the masking buffer layer's $Si_xN_y$, $Mg_wN_z$, or $Al_sIn_tGa_{1-s-t}N$ clusters. The roughened contact layer then grows upward until it passes (but does not cover) the clusters of the masking buffer layer for an appropriate distance.

In the present invention, due to that the masking buffer layer is developed first, the surfaces of the GaN-basd LEDs would therefore be roughened. This design avoids the total internal reflection that could have been resulted from the GaN-based LEDs' higher index of refraction than that of the atmosphere, which in turn would improve the external quantum efficiency and luminous efficiency of the GaN-based LEDs.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The accompanied drawings are provided to illustrate the various embodiments of the present invention as described in this specification, so as to achieve better understanding of the major objectives of the present invention.

DETAILED DESCRIPTION OF THE PREFERRED EMBODIMENTS

In the following, detailed description along with the accompanied drawings is given to better explain preferred embodiments of the present invention. Please be noted that, in the accompanied drawings, some parts are not drawn to scale or are somewhat exaggerated, so that people skilled in the art can better understand the principles of the present invention.

Figure 1:
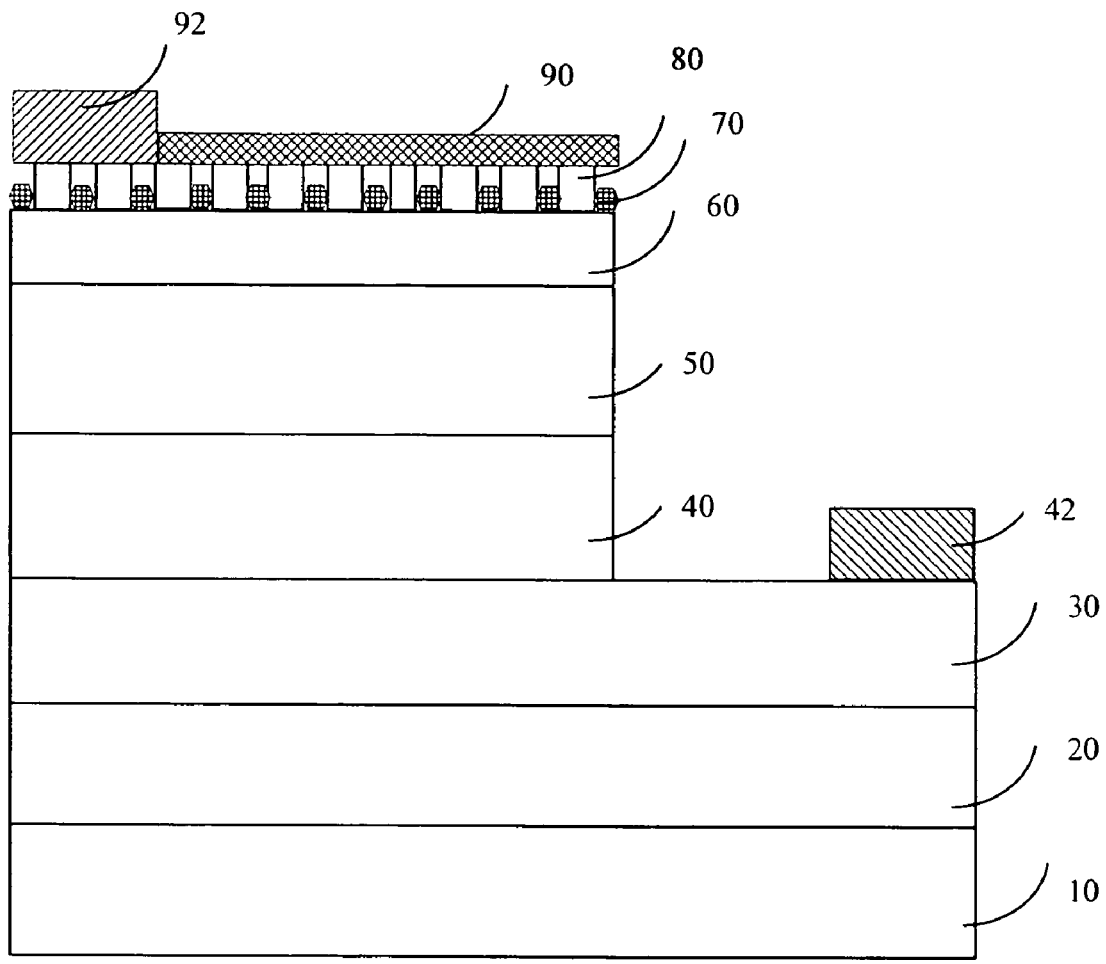
FIG. 1 is a schematic diagram showing a high-brightness GaN-based LED device according to a first embodiment of the present invention.

FIG. 1 is a schematic diagram showing a high-brightness GaN-based LED device according to a first embodiment of the present invention. As shown in FIG. 1, the GaN-based LED device has a substrate 10 made of C-plane, R-plane, or A-plane aluminum-oxide monocrystalline (sapphire), or an oxide monocrystalline having a lattice constant compatible with that of nitride semiconductors. The substrate 10 can also be made of SiC (6H—SiC or 4H—SiC), Si, ZnO, GaAs, or $MgAl_2O_4$. Generally, the most common material used for the substrate 10 is sapphire or SiC. An optional buffer layer 20 made of a GaN-based material whose molecular formula could be expressed as $Al_aGa_bIn_{1-a-b}N$ ($0 \leq a,b<1$, $a+b \leq 1$) having a specific composition is then formed on an upper side of the substrate 10. On top of the buffer layer 20, a first contact layer 30 is formed and made of a GaN-based material having a first conduction type (e.g., it could be a p-typed GaN or n-typed GaN). Then, on top of the first contact layer 30, an active layer 40 made of a GaN-based material such as indium-gallium-nitride (InGaN) is formed on top of the first contact layer 30.

On top of the active layer 40, an optional cladding layer 50 made of a GaN-based material having a second conduction type opposite to that of the first contact layer 30. In other words, for example, if the first contact layer 30 is made of an n-typed GaN-based material, then the cladding layer 50 is made of a p-typed GaN-based material. Then, on top of the active layer 40 (if there is no cladding layer 50) or the cladding layer 50, a second contact layer 60 made of a GaN-based material having the second conduction type opposite to that of the first contact layer 30 is formed. Again, on top of the second contact layer 60, a masking buffer layer 70, which is the major characteristic of the present invention, is formed. In the present embodiment, the masking buffer layer 70 is developed by using a group-IV nitride $Si_cN_d$ ($c,d \geq 1$) having a specific composition in a MOCVD process at a growing temperature between 600° C. and 1100° C. and up to a thickness between 5 Å and 100 Å. The masking buffer layer 70, thus formed, contains multiple randomly distributed clusters of $Si_cN_d$ on the second contact layer 60.

On top of the masking buffer layer 70, a roughened contact layer 80, which is another major characteristic of the present invention, is formed. The roughened contact layer 80 is made of a GaN-based material having the second conduction type and whose molecular formula could be expressed as $Al_eIn_fGa_{1-e-f}N$, ($0 \leq e,f<1$, $e+f \leq 1$). The roughened contact layer 80 has a specific composition, a thickness between 500 Å and 10,000 Å, and is formed at a growing temperature between 800° C. and 1100° C. The roughened contact layer 80 does not grow directly on top of the masking buffer layer 70. Instead, the roughened contact layer 80 starts from the top surface of the underlying second contact layer 60 not covered by the masking buffer layer 70's $Si_cN_d$ clusters. The roughened contact layer 80 then grows upward until it passes over, but does not cover, the $Si_cN_d$ clusters of the masking buffer layer 70 for an appropriate distance.

Up to this point, the epitaxial structure of the present invention has been completed. To package the epitaxial structure into a LED device, the electrodes for the LED device have to be formed. Conventionally, the epitaxial structure is appropriately etched to expose a portion of the first contact layer 30 and, then, a first electrode 42 made of an appropriate metallic material is formed on top of the exposed first contact layer 30.

On the other hand, on top of roughened contact layer 80, an optional transparent conductive layer 90 could be formed. The transparent conductive layer 90 can be a metallic conductive layer or a transparent oxide layer. The metallic conductive layer is made of one of the materials including, but not limited to, Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, Ni/Pd/Au alloy, and other similar materials. The transparent oxide layer, on the other hand, is made of one of the materials including, but not limited to, ITO, CTO, ZnO:Al, $ZnGa_2O_4$, $SnO_2$:Sb, $Ga_2O_3$: Sn, $AgInO_2$:Sn, $In_2O_3$:Zn, $CuAlO_2$, LaCuOS, NiO, $CuGaO_2$, and $SrCu_2O_2$. A second electrode 92 is formed on top of the transparent conductive layer 90 or besides the transparent conductive layer 90 as shown in the accompanied drawings. The second electrode 92 is made of one of the materials including, but not limited to, Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ ($x \geq 0$), $WSi_y$ ($y \geq 0$), and other similar metallic materials.

Figure 2:
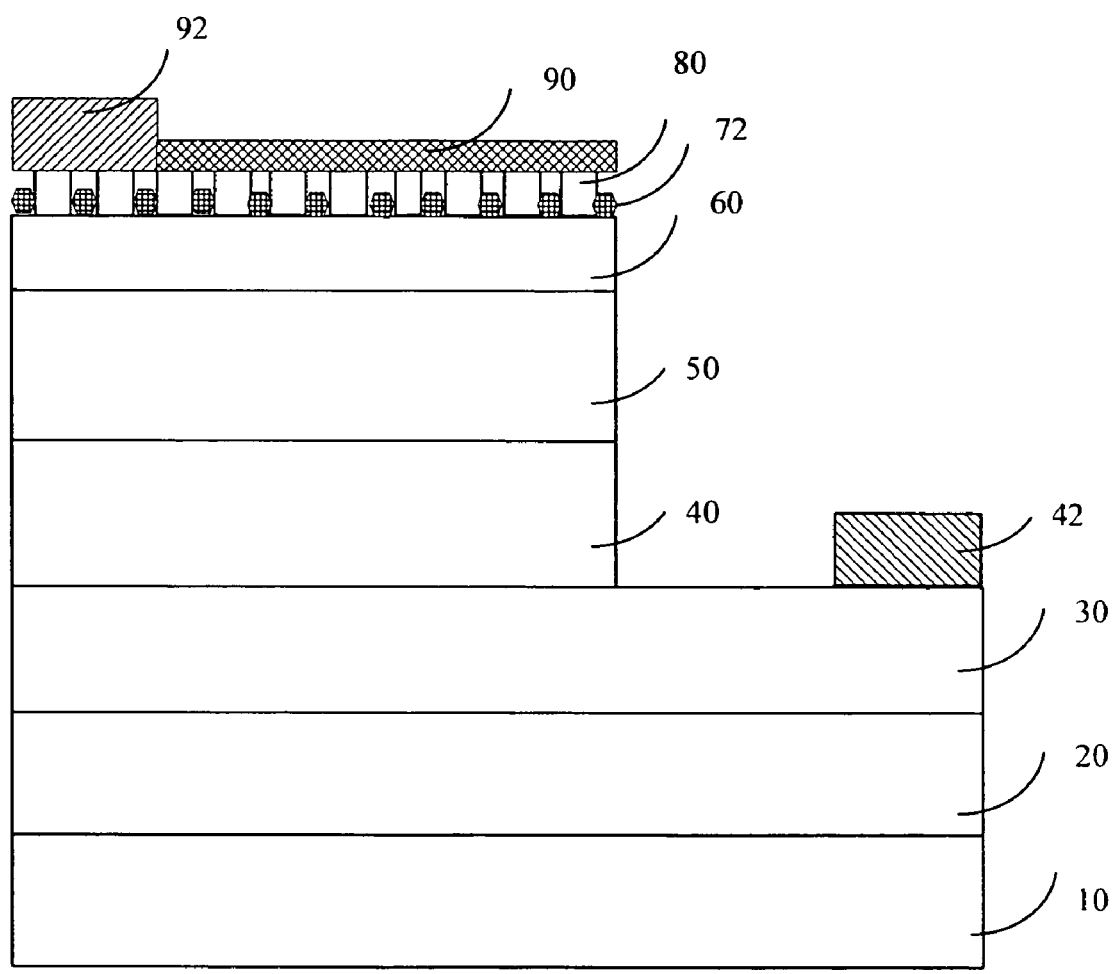
FIG. 2 is a schematic diagram showing a high-brightness GaN-based LED device according to a second embodiment of the present invention.

FIG. 2 is a schematic diagram showing a high-brightness GaN-based LED device according to a second embodiment of the present invention. As shown in FIG. 2, the present embodiment has an identical structure as in the previous embodiment. The only difference lies in the material used for the masking buffer layer. In the present embodiment, the masking buffer layer 72 is developed also by a MOCVD process using a group-II nitride $Mg_gN_h$ ($g,h \geq 1$) having a specific composition. The masking buffer layer 72 has a thickness between 5 Å and 100 Å and is formed at a growing temperature between 600° C. and 1100° C. Similarly, the masking buffer layer 72 thus formed contains multiple randomly distributed clusters of $Mg_gN_h$ on top of the second contact layer 60.

Figure 3:
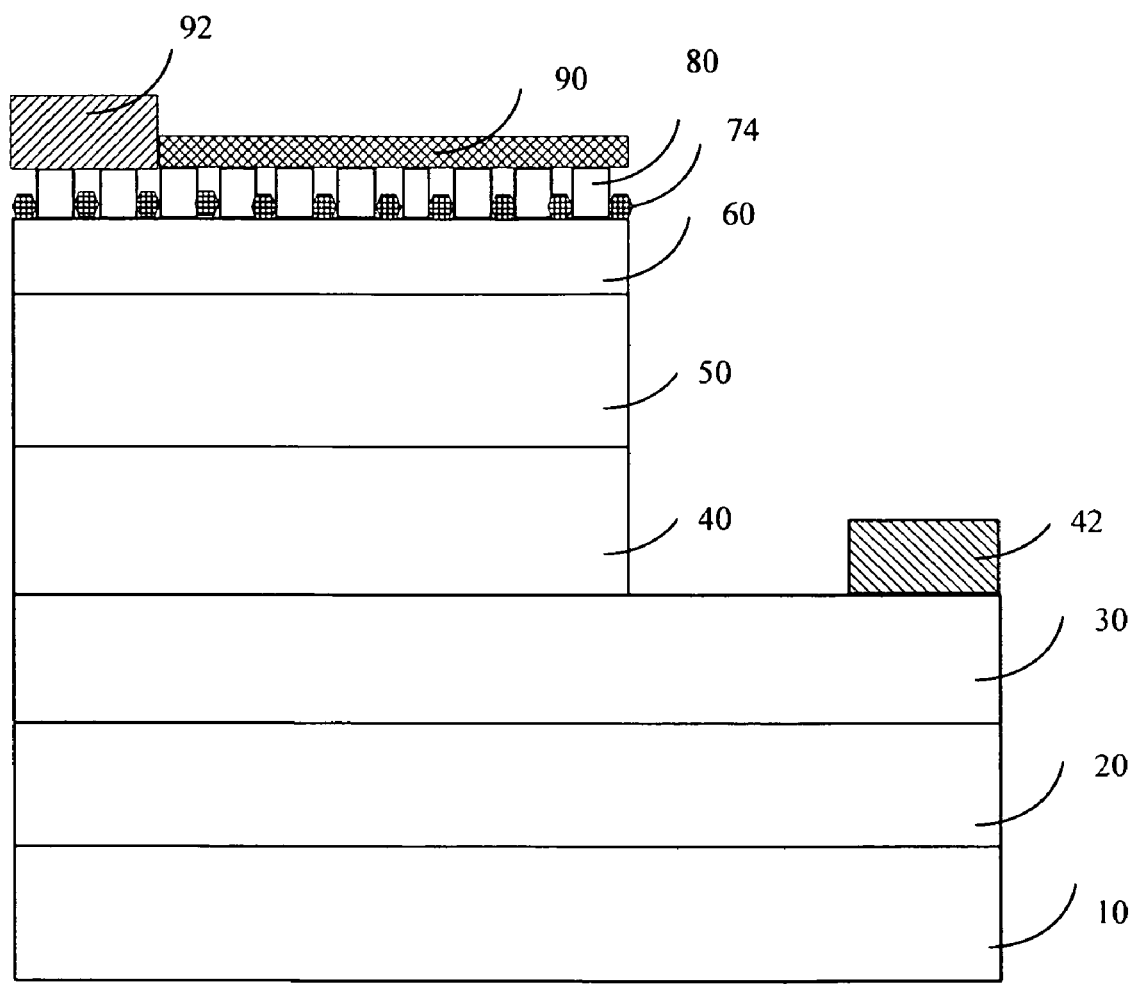
FIG. 3 is a schematic diagram showing a high-brightness GaN-based LED device according to a third embodiment of the present invention.

FIG. 3 is a schematic diagram showing a high-brightness GaN-based LED device according to a third embodiment of the present invention. As shown in FIG. 3, the present embodiment has an identical structure as in the previous embodiments. The only difference lies in the material used for the masking buffer layer. In the present embodiment, the masking buffer layer 74 is developed also by a MOCVD process using a heavily doped group-III nitride $Al_kIn_lGa_{1-k-l}N$ ($0 \leq k,l<1$, $k+l \leq 1$) having a specific composition. The $Al_kIn_lGa_{1-k-l}N$ is doped with at least a dopant selected from the group-II and group-IV elements. For example, the dopant used could be Si, Mg, or both Si and Mg could be used. The doping density is at least $1 \times 10^{20}$ $cm^{-3}$. The masking buffer layer 74 has a thickness between 5 Å and 100 Å and is formed at a growing temperature between 600° C. and 1100° C. Similarly, the masking buffer layer 74 thus formed contains multiple randomly distributed clusters of $Al_kIn_lGa_{1-k-l}N$ on top of the second contact layer 60.

In aforementioned preferred embodiments of the present invention, the masking buffer layer and the roughened contact layer jointly roughen the top surface of the GaN-based LEDs. As such, the total internal reflection that could have been resulted from the GaN-based LEDs' higher index of refraction than that of the atmosphere is thereby avoided. The GaN-based LEDs according to the present invention therefore have superior external quantum efficiency and luminous efficiency.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A high-brightness GaN-based LED structure, comprising:
   a substrate;
   a first contact layer made of a GaN-based material having a first conduction type located on top of said substrate;
   an active layer made of a GaN-based material located on top of said first contact layer;
   a second contact layer made of a GaN-based material having a second conduction type opposite to said first conduction type located on top of said active layer;

a masking buffer layer comprising a plurality of randomly distributed clusters made of a group II, III or IV nitride located on top of said second contact layer; and a roughened contact layer made of a GaN-based material having said second conduction type grown from the top surface of said second contact layer not covered by said masking buffer layer up to an appropriate distance over but not covering said masking buffer layer.

2. The high-brightness GaN-based LED structure as claimed in claim 1, wherein said active layer is made of InGaN.

3. The high-brightness GaN-based LED structure as claimed in claim 1, further comprising a buffer layer made of a GaN-based material interposed between said substrate and said first contact layer.

4. The high-brightness GaN-based LED structure as claimed in claim 3, wherein said buffer layer is made of $Al_aGa_bIn_{1-a-b}N$ ($0 \leq a,b<1$, $a+b \leq 1$) having a specific composition.

5. The high-brightness GaN-based LED structure as claimed in claim 1, wherein said roughened contact layer is made of $Al_eIn_fGa_{1-e-f}N$, ($0 \leq e,f<1$, $e+f \leq 1$) having a specific composition.

6. The high-brightness GaN-based LED structure as claimed in claim 1, wherein said roughened contact layer has a thickness between 500 Å and 10,000 Å.

7. The high-brightness GaN-based LED structure as claimed in claim 1, further comprising a cladding layer made of a GaN-based material having said second conduction type interposed between said active layer and said second contact layer.

8. The high-brightness GaN-based LED structure as claimed in claim 1, wherein said masking buffer layer has a thickness between 5 Å and 100 Å.

9. The high-brightness GaN-based LED structure as claimed in claim 1, wherein said masking buffer layer is made of $Si_cN_d$ ($c,d \geq 1$) having a specific composition.

10. The high-brightness GaN-based LED structure as claimed in claim 1, wherein said masking buffer layer is made of $Mg_gN_h$ ($g,h \geq 1$) having a specific composition.

11. The high-brightness GaN-based LED structure as claimed in claim 1, wherein said masking buffer layer is made of $Al_kIn_lGa_{1-k-l}N$ ($0 \leq k,l<1$, $k+l \leq 1$) having a specific composition and doped up to an appropriate density with at least a dopant selected from group-II and group-IV elements.

12. The high-brightness GaN-based LED structure as claimed in claim 11, wherein said density of said dopant is at least $1 \times 10^{20}$ cm$^{-3}$.

13. A high-brightness GaN-based LED device, comprising:
a substrate;
a buffer layer made of $Al_aGa_bIn_{1-a-b}N$ ($0 \leq a,b<1$, $a+b \leq 1$) having a specific composition located on top of an upper side of said substrate;
a first contact layer made of a GaN-based material having a first conduction type located on top of said buffer layer;
an active layer made of InGaN located on top of a part of said first contact layer's upper surface;
a first electrode located on top of another part of said first contact layer's upper surface not covered by said active layer;
a second contact layer made of a GaN-based material having a second conduction type opposite to said first conduction type located on top of said active layer;
a masking buffer layer comprising a plurality of randomly distributed clusters made of a group II, III or IV nitride located on top of said second contact layer;
a roughened contact layer made of a GaN-based material having said second conduction type grown from the top surface of said second contact layer not covered by said masking buffer layer up to an appropriate distance over but not covering said masking buffer layer;
a transparent conductive layer that is one of a metallic conductive layer and a transparent oxide layer located on top of said roughened contact layer's upper surface; and
a second electrode located on top of said transparent conductive layer or on top of another part of said roughened contact layer's upper surface not covered by said transparent conductive layer.

14. The high-brightness GaN-based LED device as claimed in claim 13, wherein said metallic conductive layer is made of a material selected from the group consisting of Ni/Au alloy, Ni/Pt alloy, Ni/Pd alloy, Pd/Au alloy, Pt/Au alloy, Cr/Au alloy, Ni/Au/Be alloy, Ni/Cr/Au alloy, Ni/Pt/Au alloy, and Ni/Pd/Au alloy.

15. The high-brightness GaN-based LED device as claimed in claim 13, wherein said transparent oxide layer is made of a material selected from the group consisting of ITO, CTO, ZnO:Al, $ZnGa_2O_4$, $SnO_2$:Sb, $Ga_2O_3$:Sn, $AgInO_2$:Sn, $In_2O_3$:Zn, $CuAlO_2$, LaCuOS, NiO, $CuGaO_2$, and $SrCu_2O_2$.

16. The high-brightness GaN-based LED device as claimed in claim 13, wherein said second electrode is made of a material selected from the group consisting of Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ ($x \geq 0$), and $WSi_y$ ($y \geq 0$).

17. The high-brightness GaN-based LED device as claimed in claim 13, further comprising a cladding layer made of a GaN-based material having said second conduction type interposed between said active layer and said second contact layer.

18. The high-brightness GaN-based LED device as claimed in claim 13, wherein said roughened contact layer is made of $Al_eIn_fGa_{1-e-f}N$, ($0 \leq e,f<1$, $e+f \leq 1$) having a specific composition.

19. The high-brightness GaN-based LED device as claimed in claim 13, wherein said roughened contact layer has a thickness between 500 Å and 10,000 Å.

20. The high-brightness GaN-based LED device as claimed in claim 13, wherein said masking buffer layer has a thickness between 5 Å and 100 Å.

21. The high-brightness GaN-based LED device as claimed in claim 13, wherein said masking buffer layer is made of $Si_cN_d$ ($c,d \geq 1$) having a specific composition.

22. The high-brightness GaN-based LED device as claimed in claim 13, wherein said masking buffer layer is made of $Mg_gN_h$ ($g,h \geq 1$) having a specific composition.

23. The high-brightness GaN-based LED device as claimed in claim 13, wherein said masking buffer layer is made of $Al_kIn_lGa_{1-k-l}N$ ($0 \leq k,l<1$, $k+l \leq 1$) having a specific composition and doped up to an appropriate density with at least a dopant selected from group-II and group-IV elements.

24. The high-brightness GaN-based LED structure as claimed in claim 23, wherein said density of said dopant is at least $1 \times 10^{20}$ cm$^{-3}$.

* * * * *